(12) United States Patent
Geerts-Ossevoort et al.

(10) Patent No.: US 9,159,145 B2
(45) Date of Patent: Oct. 13, 2015

(54) FAST DUAL CONTRAST MR IMAGING

(75) Inventors: Liesbeth Geerts-Ossevoort, Veldhoven (NL); Frederik Visser, Houten (NL)

(73) Assignee: Koninklijke Philips N.V., Eindhoven (NL)

( * ) Notice: Subject to any disclaimer, the term of this patent is extended or adjusted under 35 U.S.C. 154(b) by 295 days.

(21) Appl. No.: 13/995,271

(22) PCT Filed: Dec. 9, 2011

(86) PCT No.: PCT/IB2011/055561
§ 371 (c)(1),
(2), (4) Date: Jun. 18, 2013

(87) PCT Pub. No.: WO2012/085733
PCT Pub. Date: Jun. 28, 2012

(65) Prior Publication Data
US 2013/0266203 A1  Oct. 10, 2013

(30) Foreign Application Priority Data
Dec. 21, 2010  (EP) .................................... 10196091

(51) Int. Cl.
*G06K 9/00* (2006.01)
*G06T 11/00* (2006.01)
*G01R 33/561* (2006.01)
*G01R 33/563* (2006.01)

(52) U.S. Cl.
CPC .......... *G06T 11/003* (2013.01); *G01R 33/5619* (2013.01); *G01R 33/5635* (2013.01)

(58) Field of Classification Search
None
See application file for complete search history.

(56) References Cited

U.S. PATENT DOCUMENTS

| 5,229,717 A | 7/1993 | Hinks |
| 5,271,399 A | 12/1993 | Listerud |
| 5,830,143 A | 11/1998 | Mistretta |
| 6,340,887 B1 | 1/2002 | Liu |

(Continued)

OTHER PUBLICATIONS

Kimura et al (NPL: Hybrid of Opposite-Contrast MR Angiography (HOP-MRA) Combining Time-of-flight and Flow Sensitive Black-Blood Contrasts, Magnetic Resonance in Medicine 62:450-458 (2009)).*

(Continued)

*Primary Examiner* — Bhavesh Mehta
*Assistant Examiner* — Oneal R Mistry

(57) ABSTRACT

The invention relates to a method of MR imaging of at least a portion of a body (10) of a patient placed in an examination volume of a MR device (1). The method comprises the steps of: -subjecting the portion of the body (10) to a first imaging sequence for acquiring a first signal data set (31, 32) from a central portion of k-space, wherein magnetic resonance is excited by means of RF pulses having a large flip angle ($\alpha_1$); -subjecting the portion of the body (10) to a second imaging sequence for acquiring a second signal data set (33, 34) from the central portion of k-space, wherein magnetic resonance is excited by means of RF pulses having a small flip angle ($\alpha_2$); -subjecting the portion of the body (10) to a third imaging sequence for acquiring a third signal data set (35, 36) at least from a peripheral portion of k-space, wherein magnetic resonance is excited by means of RF pulses having an intermediate flip angle ($\alpha$ 3); -reconstructing a first MR image (37) from a combination of the first signal data set (31, 32) and the third signal data set (35, 36) and -reconstructing a second MR image (38) from a combination of the second signal data set (33, 34) and the third signal data set (35, 36).

12 Claims, 2 Drawing Sheets

(56) References Cited

U.S. PATENT DOCUMENTS

| | | |
|---|---|---|
| 7,609,058 B2 | 10/2009 | Laub |
| 2001/0033162 A1 | 10/2001 | Harvey |
| 2006/0279282 A1 | 12/2006 | Van Den Brink |
| 2008/0231273 A1* | 9/2008 | Kabasawa .................. 324/309 |
| 2011/0096974 A1* | 4/2011 | Gilson ....................... 382/131 |
| 2011/0275926 A1* | 11/2011 | Du ............................. 600/410 |

OTHER PUBLICATIONS

Coolen et al (NPL: 3D black-blood TI mapping of the mouse heart using IntraGate FLASH and Despot1 analysis, Proc. Intl. Soc. Mag. Reson. Med. 17 (2009) p. 1749.*

Tan et al (NPL: "Fast Inversion Recovery Magnetic Resonance Angiography of the Intracranial Arteries," NIH Publication 2011, Magn Reson Med. Jun. 2010; 63(6): 1648-1658. doi:10.1002/mrm.22456.*

Kimura, Tokunori et al "Hybrid of Opposite-Contrast MR Angiography (HOP-MRA) Combining Time of Flight and Flow Sensitive Black Blood Contrasts", Magnetic Resonance in Medicine, vol. 62, 2009, pp. 450-458.

Hyon, M. et al "Magnetic Resonance Angiography can Serially Evaluate Thrombolysis of In-Stent Thrombus", Proceedings of the Int'l Society of Magnetic Resonance in Medicine, May 2004, pp. 1914.

Coolen, B.F. et al "3D Black Blood TI Mapping of the Mouse Heart using IntraGate FLASH and DESPOT1 Analysis", Proceedings of the Int'l Society of Magnetic Resonance in Medicine, Apr. 2009, p. 1749.

Edelman, R.R. et al "Extracranial Carotid Arteries: Evaluation with "Black Blood" MR Angiography", Radiology, vol. 77, Oct. 1990, pp. 45-50.

* cited by examiner

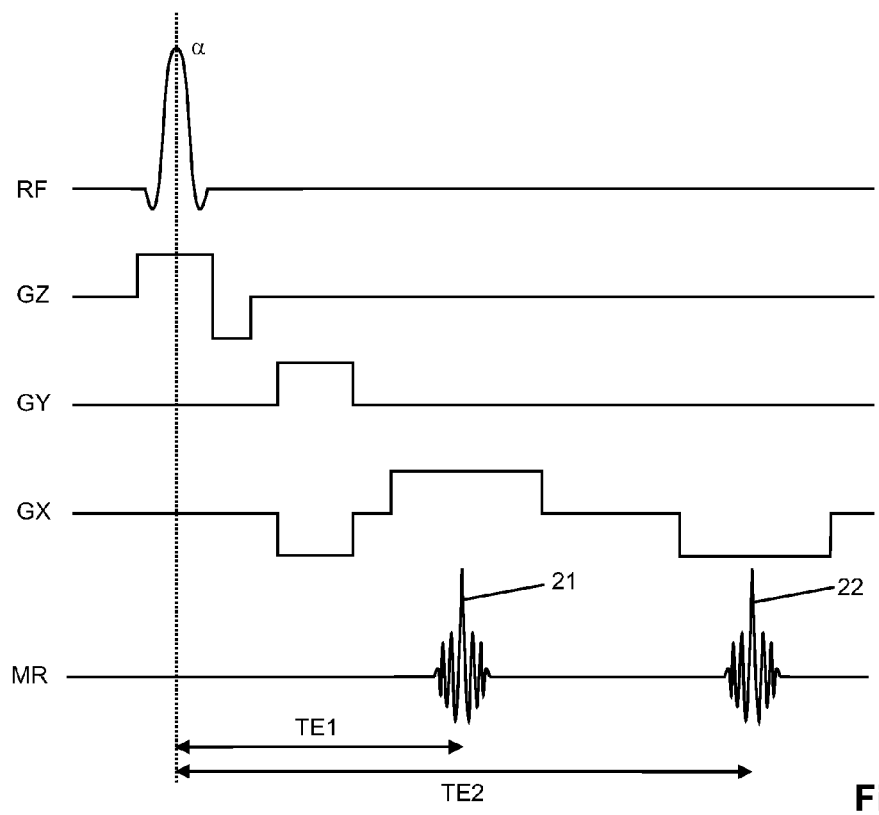
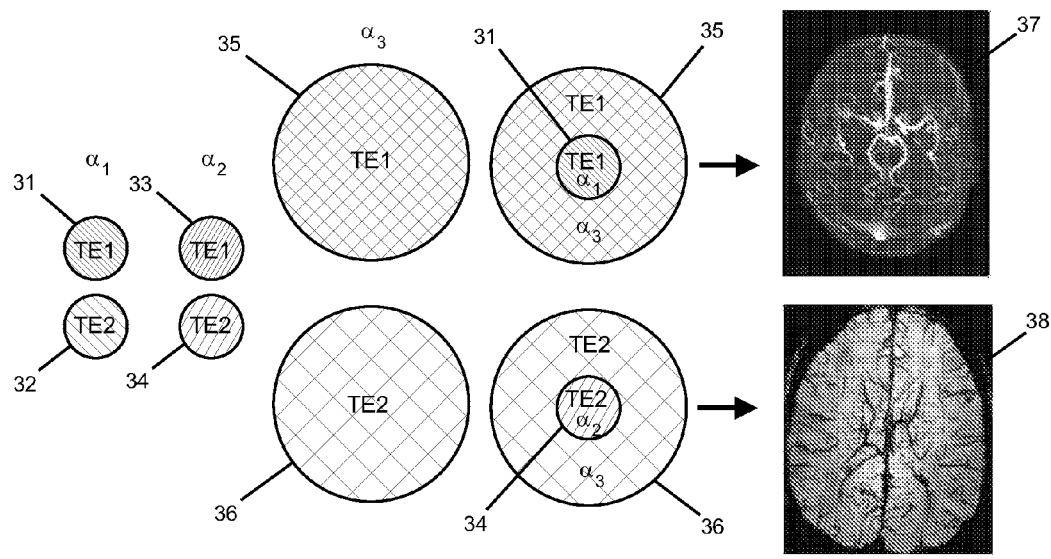
Fig. 2
Fig. 3

FAST DUAL CONTRAST MR IMAGING

CROSS-REFERENCE TO PRIOR APPLICATIONS

This application is the U.S. National Phase application under 35 U.S.C. §371 of International Application No. PCT/IB2011/055561, filed on Dec. 9, 2011, which claims the benefit of European Patent Application No. 10196091.2, filed on Dec. 21, 2010. These applications are hereby incorporated by reference herein.

FIELD OF THE INVENTION

The invention relates to the field of magnetic resonance (MR) imaging. It concerns a method of MR imaging of at least a portion of a body of a patient placed in an examination volume of a MR device. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the magnetic field extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of one or more receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, linear magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The signal data obtained via the RF coils corresponds to the spatial frequency domain and is called k-space data. The k-space data usually includes multiple lines acquired with different phase encoding. Each line is digitized by collecting a number of samples. A set of k-space data is converted to a MR image by means of Fourier transformation.

Magnetic resonance angiography (MRA) is a group of techniques based on MR imaging for the purpose of imaging blood vessels. MRA is used to generate images of the arteries in order to evaluate them for stenosis, occlusion or aneurysms. MRA is often used to evaluate the arteries of the neck and brain, the thoracic and abdominal aorta, the renal arteries, and the legs. Further known are magnetic resonance venography (MRV) techniques which are used to generate images of the veins.

MRA methods can be divided into "bright blood" and "dark blood" techniques. In bright blood angiography or time of flight (TOF) angiographs, MR signals from flowing blood are optimized, while MR signals from stationary tissue are suppressed. Dark blood MRA typically uses a short echo time in combination with large flip angles for excitation of magnetic resonance. As flowing blood enters the area actually being imaged it has seen a limited number of RF excitation pulses so it is not saturated. Consequently, the MR signals from the flowing blood are of much higher amplitude than the MR signals from the saturated stationary tissue. The use of large flip angles leads to high MR signal amplitudes from the freshly inflowing moving spins of the blood within the imaged volume. Simultaneously, an effective suppression of the static spins is achieved by the use of large flip angles. As a consequence, bright blood vessels are depicted against a dark background in the resulting bright blood MR images.

In contrast, dark blood MRA methods utilize a flow-related signal void. The MR signals from flowing blood are suppressed, while the MR signals from stationary tissue are optimized. In other words, the flowing blood is made to appear dark or black in the resulting MR image due to an absence or minimum of MR signal emanating from the flowing blood. Dark blood MRA typically employs a small flip angle and a long echo time. Due to the long echo time, the MR signal from moving blood spins has decayed relative to its surroundings at the instant of signal acquisition. A low flip angle is employed for excitation of magnetic resonance in order to maintain MR signals from the static tissue surrounding the blood vessels.

In practice it is sometimes desirable to apply both dark blood and bright blood MRA in order to have the complementary information of the two contrast types available for diagnosis. The problem is that two complete scans are required in order to obtain both bright blood and dark blood MR images which results in a correspondingly long scan time.

From the foregoing it is readily appreciated that there is a need for an improved MR imaging technique. It is consequently an object of the invention to enable dual contrast MR imaging at a reduced acquisition time.

SUMMARY OF THE INVENTION

In accordance with the invention a method of MR imaging of a least a portion of a body of a patient placed in an examination volume of a MR device is disclosed. The method comprises the steps of:

subjecting the portion of the body to a first imaging sequence for acquiring a first signal data set from a central portion of k-space, wherein magnetic resonance is excited by means of RF pulses having a large flip angle;

subjecting the portion of the body to a second imaging sequence for acquiring a second signal data set from the central portion of k-space, wherein magnetic resonance is excited by means of RF pulses having a small flip angle;

subjecting the portion of the body to a third imaging sequence for acquiring a third signal data set at least from a peripheral portion of k-space, wherein magnetic resonance is excited by means of RF pulses having an intermediate flip angle;

reconstructing a first MR image from a combination of the first signal data set and the third signal data set;

reconstructing a second MR image from a combination of the second signal data set and the third signal data set.

The gist of the invention is the application of a keyhole approach for fast acquisition of two MR images having a different contrast. The contrast of the two MR images is determined (amongst others) by the different flip angles employed for excitation of magnetic resonance in the first and second imaging sequences respectively. According to the invention only the central portion of k-space, which essentially determines the contrast of the resulting MR images, is scanned two times, one time by means of the first imaging sequence using a large flip angle and a second time by means of the second imaging sequence using a smaller flip angle. The remaining peripheral portion of k-space, which determines the resolution of the resulting MR images, is scanned only once, namely by means of the third imaging sequence using an intermediate flip angle, i.e. a flip angle between the large flip angle of the first imaging sequence and the small flip angle of the second imaging sequence. Hence, the invention enables dual contrast imaging at a comparatively short acquisition time, since the peripheral portion of k-space has to be scanned only once. The large flip angle of the first imaging sequence and the small flip angle of the second imaging sequence can be optimized individually in order to obtain the desired contrast. The value of the intermediate flip angle of the third imaging sequence and the subdivision of the required k-space region into central and peripheral portions can be selected according to the respective application in order to find an optimal balance between scan time and image contrast.

According to a preferred embodiment of the invention, the first, second, and third imaging sequences are dual-echo sequences such that each of the first, second, and third signal data sets comprises first and second echo signals successively acquired at different echo times. In this way the contrast of the first and second MR images reconstructed in accordance with the invention is determined not only by the different flip angles of the first and second imaging sequences but also by the different echo times at which the first and second echo signals are acquired.

In particular, the first MR image can be a bright blood image that is reconstructed from a combination of the first echo signals of the first signal data set and the first echo signals of the third signal data set, wherein the second MR image is a dark blood image that is reconstructed from a combination of the second echo signals of the second signal data set and the second echo signals of the third signal data set. This embodiment of the invention enables the acquisition of both a bright blood image and a dark blood image within the scan time of essentially only a single scan. The dark blood image is reconstructed from MR signals acquired at a short echo time while the dark blood image is reconstructed from MR signals acquired at a long echo time. The first and second echo signals can be acquired essentially without the requirement of additional scan time since the employed imaging sequence is a dual-echo sequence which generates successive first and second echo signals after a single excitation of magnetic resonance. For reconstructing the dark blood image, central k-space data acquired by using the large flip angle is combined with peripheral k-space data acquired by using the intermediate flip angle. The bright blood image is reconstructed by combining central k-space data acquired by using the small flip angle with peripheral k-space data acquired by using the intermediate flip angle.

According to a preferred embodiment of the invention, the first, second, and third imaging sequences are field echo sequences. For example a dual-echo 3D FFE sequence can be optimized such that the first echo signal data can be reconstructed into a bright blood image while the second echo signal data can be reconstructed into a dark blood image.

According to another preferred embodiment of the invention, the first, second, and third imaging sequences are steady-state sequences. Steady-state imaging sequences enable particularly fast image acquisition. A steady-state sequence is any imaging sequence in which a non-zero steady-state develops for the transverse and longitudinal spin magnetization. The repetition time, i.e. the time interval between two consecutive excitation RF pulses in the steady-state sequence, is shorter than both the longitudinal and the transverse relaxation times. Dual echo steady-state imaging sequences can be applied according to the invention. In this case two gradient or spin echoes are acquired during a single interval between consecutive RF excitation pulses.

The dual contrast keyhole concept of the invention can easily be extended to simultaneous acquisition of a proton density weighted image and a $T_2$ weighted image, or a $T_1$ weighted image and a proton density weighted image.

Due to the application of different flip angles in the first imaging sequence and the second imaging sequence, a discontinuity exists in the signal amplitudes of the first, second, and third signal data sets. To this end, the first, second, and/or third signal data sets should be corrected according to a preferred embodiment of the invention such that a smooth transition of signal amplitude between the central k-space data and the peripheral k-space data is achieved before reconstruction of the first and second MR images.

According to yet another preferred embodiment, the third signal data set is acquired from complete k-space including the central and peripheral regions of k-space. It is possible to acquire MR signals from complete k-space by means of the third imaging sequence without considerably increasing the total scan time. The advantage of this approach is that the third signal data acquired from the central portion of k-space can be used to reconstruct the images with a smooth transition between the central k-space data and the peripheral k-space data of the first, second, and third signal data sets.

The method of the invention described thus far can be carried out by means of a MR device including at least one main magnet coil for generating a uniform steady magnetic field within an examination volume, a number of gradient coils for generating switched magnetic field gradients in different spatial directions within the examination volume, at least one RF coil for generating RF pulses within the examination volume and/or for receiving MR signals from a body of a patient positioned in the examination volume, a control unit for controlling the temporal succession of RF pulses and switched magnetic field gradients, a reconstruction unit, and a visualization unit. The method of the invention is preferably implemented by a corresponding programming of the reconstruction unit, the visualization unit, and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings:

FIG. 2 schematically shows the first, second, and third imaging sequences employed according to the invention;

FIG. 3 shows a diagram illustrating the method of the invention.

DETAILED DESCRIPTION OF EMBODIMENTS

Figure 1:
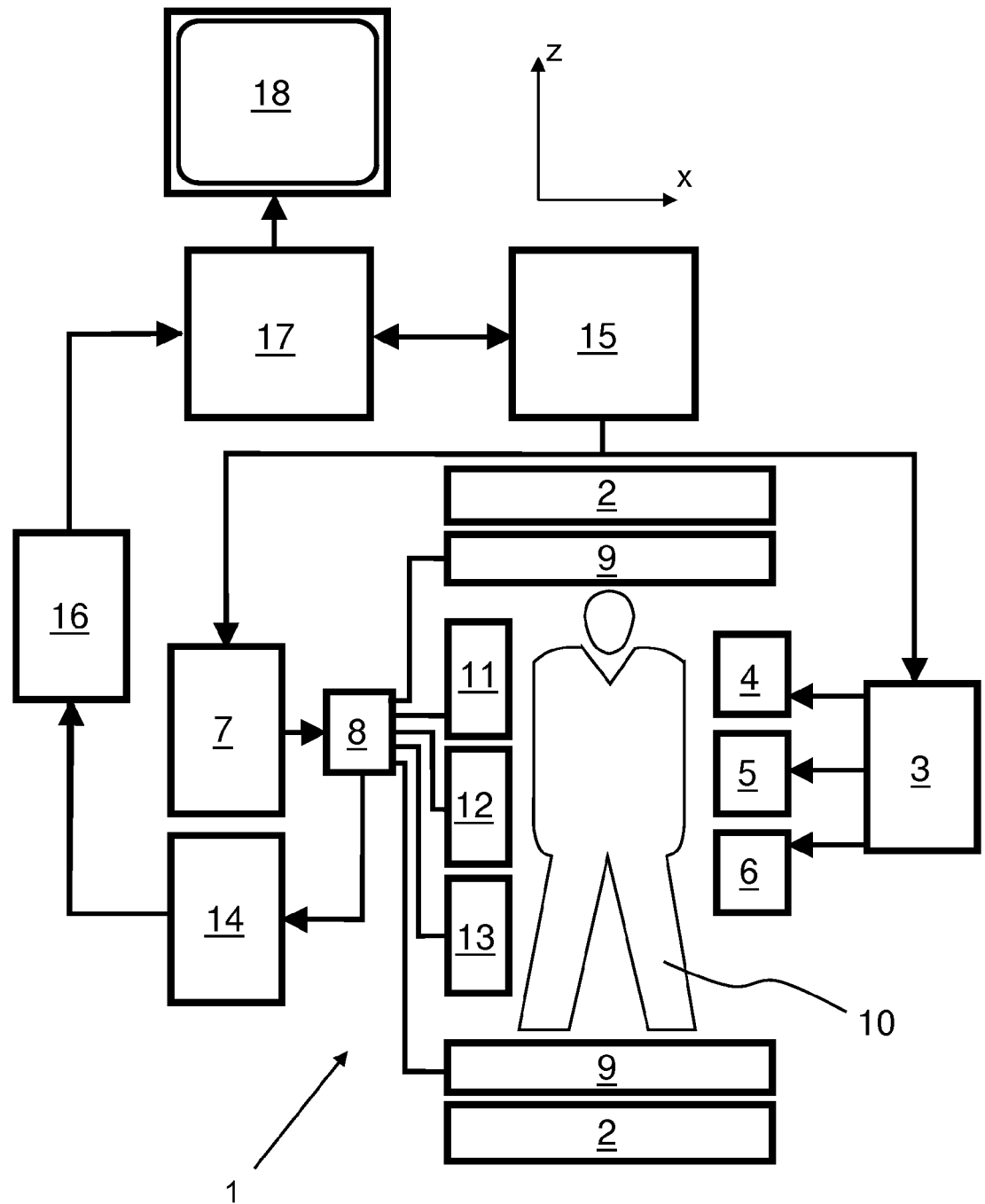
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a whole-body volume RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the whole-body volume RF coil 9.

For generation of MR images of limited regions of the body 10, a set of local array RF coils 11, 12, 13 are placed contiguous to the region selected for imaging. The array coils 11, 12, 13 can be used to receive MR signals induced by body-coil RF transmissions.

The resultant MR signals are picked up by the whole body volume RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms (such like SENSE or SMASH for example). The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image. With continuing reference to FIG. 1 and with further reference to FIGS. 2 and 3, an embodiment of the imaging approach of the invention is explained.

FIG. 2 shows a sequence diagram of the first, second, and third imaging sequences according to the invention. Magnetic resonance is excited by means of a RF pulse having a flip angle α. A slice-selection gradient GZ is switched on during the irradiation of the excitation RF pulse. A phase-encoding gradient GY is applied corresponding to the k-space segment currently acquired. The depicted sequence is a dual-echo sequence, by means of which first and second echo signals 21 and 22 are generated as field echoes by switching the gradient GX accordingly. The first and second echo signals are acquired at different echo times TE1 and TE2.

As illustrated in FIG. 3, a first imaging sequence is used initially for acquiring MR signal data from a central portion of k-space, wherein magnetic resonance is excited by means of a RF pulse having a large flip angle $\alpha_1$. Typical values of $\alpha_1$ are between 18 and 30 degrees. The dual-echo sequence depicted in FIG. 2 is applied in order to acquire MR signal data 31 at the (short) first echo time TE1 and MR signal data 32 at the (long) second echo time TE2. The MR signal data 31 and 32 are acquired only from the central portion of k-space and together constitute a first signal data set within the meaning of the invention. Further, a second imaging sequence is used for acquiring a second signal data set comprising MR signal data 33 and 34. The RF pulses for exciting magnetic resonance in the second imaging sequence have a small flip angle $\alpha_2$. Typical values of $\alpha_2$ are in the range from 10 to 16 degrees. The MR signal data 33 is acquired at the first echo time TE1, while the MR signal data 34 is acquired at the second echo time TE2. By means of a third imaging sequence a third signal data set comprising MR signal data 35 and 36 is acquired, the flip angle $\alpha_3$ of the third imaging sequence having an intermediate value between $\alpha_1$ and $\alpha_2$. The third signal data set is acquired from complete k-space including the central region of k-space covered by the first and second imaging sequences as well as the peripheral portions of k-space that are required in order to obtain the desired image resolution. Finally, the MR signal data 31 and 35 are combined. A first MR image 37 is reconstructed from this combination. The first MR image 37 is a bright blood image. Further, the MR signal data 34 and 36 are combined and a second MR image 38 is reconstructed from this combination. The second MR image 38 is a dark blood image. The bright blood image 37 is reconstructed from MR signal data acquired at the (short) first echo time TE1, wherein the central portion of k-space is acquired by using the large flip angle $\alpha_1$. The dark blood image 38 is reconstructed from MR signal data 34, 36, acquired at the (long) second echo time TE2, wherein the central portion of k-space is acquired by using the small flip angle $\alpha_2$.

As illustrated in FIG. 3, the invention proposes to use a keyhole approach to enable the use of an optimal flip angle in the central portion of k-space for the contrast required in the first and second MR images respectively. In this way, a dual contrast MR imaging method is obtained without significantly increasing the scan time in comparison with a conventional single contrast imaging approach.

The invention claimed is:

1. A method of magnetic resonance (MR) imaging of at least a portion of a body of a patient placed in an examination volume of a MR device, the method comprising the steps of:
   subjecting the portion of the body to a first imaging sequence for acquiring a first signal data set limited to a central portion of k-space, wherein magnetic resonance is excited by means of radio frequency (RF) pulses having a large flip angle ($\alpha_1$);
   subjecting the portion of the body to a second imaging sequence for acquiring a second signal data set limited to the central portion of k-space, wherein magnetic resonance is excited by means of RF pulses having a small flip angle ($\alpha_2$);
   subjecting the portion of the body to a third imaging sequence for acquiring a third signal data set at least from a peripheral portion of k-space, wherein magnetic resonance is excited by means of RF pulses having an intermediate flip angle ($\alpha_3$);
   reconstructing a first MR image from a combination of the first signal data set and the third signal data set;
   reconstructing a second MR image from a combination of the second signal data set and the third signal data set.

2. The method of claim 1, wherein the first, second, and third imaging sequences are dual-echo sequences such that each of the first, second, and third signal data sets comprises first and second echo signals successively acquired at different echo times.

3. The method of claim 2, wherein the first, second, and third imaging sequences are field echo sequences.

4. The method of claim 2, wherein the first, second, and third imaging sequences are steady-state sequences.

5. The method of claim 2, wherein the first MR image is a bright blood image that is reconstructed from a combination of the first echo signals of the first signal data set and the first echo signals of the third signal data set, and wherein the second MR image is a dark blood image that is reconstructed from a combination of the second echo signals of the second signal data set and the second echo signals of the third signal data set.

6. The method of claim 1, wherein the first MR image is a proton density weighted image while the second MR image is a $T_2$ weighted image.

7. The method of claim 1, wherein the first MR image is a $T_1$ weighted image while the second MR image is a proton density weighted image.

8. The method of claim 1, wherein the first, second, and/or third signal data sets are corrected such that a smooth transition of signal amplitude between the central k-space data and the peripheral k-space data is achieved before reconstruction of the first and second MR images.

9. The method of claim 1, wherein the third signal data set is acquired from complete k-space including the central and peripheral regions of k-space.

10. A magnetic resonance (MR) device for carrying out the method as claimed in claim 1, which MR device includes at least one main magnet coil for generating a uniform, steady magnetic field within an examination volume, a number of gradient coils for generating switched magnetic field gradients in different spatial directions within the examination volume, at least one radio frequency (RF) coil for generating RF pulses within the examination volume and/or for receiving MR signals from a body of a patient positioned in the examination volume, a control unit for controlling the temporal succession of RF pulses and switched magnetic field gradients, a reconstruction unit, and a visualization unit, wherein the MR device is arranged to perform the following steps:
   subjecting at least a portion of the body to a first imaging sequence for acquiring a first signal data set limited to a central portion of k-space, wherein magnetic resonance is excited by means of RF pulses having a large flip angle ($\alpha_1$);
   subjecting the portion of the body to a second imaging sequence for acquiring a second signal data set limited to the central portion of k-space, wherein magnetic resonance is excited by means of RF pulses having a small flip angle ($\alpha_2$);
   subjecting the portion of the body to a third imaging sequence for acquiring a third signal data set at least from a peripheral portion of k-space, wherein magnetic resonance is excited by means of RF pulses having an intermediate flip angle ($\alpha_3$);
   reconstructing a first MR image from a combination of the first signal data set and the third signal data set;
   reconstructing a second MR image from a combination of the second signal data set and the third signal data set.

11. The MR device of claim 10, wherein the first, second, and third imaging sequences are dual-echo sequences such that each of the first, second, and third signal data sets comprises first and second echo signals successively acquired at different echo times, and wherein the first MR image is a bright blood image that is reconstructed from a combination of the first echo signals of the first signal data set and the first echo signals of the third signal data set, and wherein the second MR image is a dark blood image that is reconstructed from a combination of the second echo signals of the second signal data set and the second echo signals of the third signal data set.

12. A non-transitory computer readable medium to be run on a magnetic resonance (MR) device, which computer readable medium comprises instructions for:
   generating a first imaging sequence for acquiring a first signal data set limited to a central portion of k-space, wherein the first imaging sequence comprises radio frequency (RF) pulses having a large flip angle ($\alpha$1) for exciting magnetic resonance;

generating a second imaging sequence for acquiring a second signal data set limited to the central portion of k-space, wherein the first imaging sequence comprises RF pulses having a small flip angle ($\alpha_2$) for exciting magnetic resonance;
generating a third imaging sequence for acquiring a third signal data set from at least a peripheral portion of k-space, wherein the third imaging sequence comprises RF pulses having an intermediate flip angle ($\alpha_3$) for exciting magnetic resonance;
reconstructing a first MR image from a combination of the first signal data set and the third signal data set;
reconstructing a second MR image from a combination of the second signal data set and the third signal data set.

* * * * *